United States Patent

[11] 3,600,797

[72] Inventors Robert W. Bower
Palos Verdes;
Gordon A. Shifrin, Malibu, both of, Calif.

[21] Appl. No. 693,215
[22] Filed Dec. 26, 1967
[45] Patented Aug. 24, 1971
[73] Assignee Hughes Aircraft Company
Culver City, Calif.

[54] METHOD OF MAKING OHMIC CONTACTS TO SEMICONDUCTOR BODIES BY INDIRECT ION IMPLANTATION
11 Claims, 3 Drawing Figs.

[52] U.S. Cl. .......... 29/584, 29/571, 29/586, 148/1.5, 317/235
[51] Int. Cl. .......... H01l 7/18
[50] Field of Search .......... 317/235; 29/571, 576 B, 584, 586

[56] References Cited
UNITED STATES PATENTS

| | | | |
|---|---|---|---|
| 3,024,140 | 3/1962 | Schmidlin .......... | 148/1.5 |
| 3,293,085 | 12/1966 | Smith et al. .......... | 148/6.3 |

*Primary Examiner*—Paul M. Cohen
*Attorneys*—James K. Haskell and W. H. MacAllister, Jr.

ABSTRACT: Method of making ohmic contacts to a semiconductor body by applying a layer of the desired contact metal on the surface of a semiconductor, bombarding this dopant with a beam of ions to drive atoms of the contact metal into the semiconductor body, and then removing the metal layer, if desired.

INVENTORS.
ROBERT W. BOWER,
GORDON A. SHIFRIN,
BY
W. H. MacAllister Jr.
ATTORNEY.

METHOD OF MAKING OHMIC CONTACTS TO SEMICONDUCTOR BODIES BY INDIRECT ION IMPLANTATION

This invention relates to semiconductor devices and to methods for fabricating the same. More particularly, the invention relates to methods for providing the electrically conductive and nonrectifying contacts on predetermined portions or elements of a semiconductor body or device by the process of ion implantation.

As used herein the term "contact" is employed to designate materials or structures which are intentionally affixed to or incorporated in a semiconductor body or the elements of a semiconductor device so as to provide an electrical connection thereto which is nonrectifying. The term "ohmic contact" may be taken to mean that rectifying barriers or junctions are not formed between the contact material or structure and the semiconductor body or device part. Heretofore such contacts have customarily been provided by thermally alloying the requisite metals to and with the semiconductor device part or body, generally a restricted portion thereof. The alloy process is difficult to control; alloying depth is critically dependent upon time and temperature. Oft-times the required temperature is so high as to result in facilitating the introduction of undesired contaminants into the contact and/or the semiconductor body or other elements forming a part of the device structure. In certain types of devices known as field-effect transistors, for example, a metallic gate electrode is provided on an insulating layer on a semiconductor body. The temperatures involved in alloying a connection to this gate electrode are often so high as to cause contaminants to be introduced into the gate electrode insulation thus degrading device operation.

Heretofore a method for incorporating materials such as conductivity-type-determining impurities in a semiconductor body by ion implantation has been known. In this process the impurity atoms which are otherwise of neutral charge polarity are given a predetermined electrical charge and may then be said to be ionized and referred to as ions. By means of electric fields these ions may be formed into a beam or beams of desirably different cross-sectional diameters and shapes and may also be made to travel in predetermined controllable directions at predetermined controllable velocities much like the electrons in an electron beam. Hence, instead of drifting into the lattice structure of a semiconductor body in random directions, as in the well-known diffusion process, these ions can be made to enter the lattice structure at a predetermined direction and may be positioned where desired therein. Furthermore, the concentration of such impurities in a semiconductor body may be readily controllable and made uniform or graded throughout an implanted region as desired. In other words, ions of a desired conductivity-type-determining impurity may be made to enter a semiconductor body in a fixed and desired direction with little or no deviation therefrom and may be placed where desired to establish an ion-implanted region of precise geometry and depth. Among the important advantages of the process is the fact that the semiconductor body need not be heated to excessive temperatures (i.e., above 550° C.) which in other processes often deleteriously affects the semiconductor and renders precise control of fabrication tedious and expensive.

The process just described may be referred to as direct ion implantation, by which is meant that atoms of the desired implant material are ionized and directly implanted into the semiconductor body. In the copending application of G. A. Shifrin (PD 7247) filed concurrently herewith and assigned to the instant assignee, a method of indirectly implanting conductivity-type-determining impurities in a semiconductor body is taught. In this method a layer of a conductivity-type-determining material is applied on a surface of the semiconductor body and this layer is then bombarded with ions of another material which may be electrically inert so as to drive atoms of the material of the layer, by the transfer of momentum thereto, into the semiconductor body and form a region therein of the desired type of conductivity. As taught in this copending application this method is extremely useful in providing either PN junction-forming regions in a semiconductor body or ohmic contact regions having the same type of conductivity as the surrounding portions of the semiconductor body.

It is an object of the present invention to provide an improved method of making ohmic contacts to a semiconductor body or other elements associated therewith.

Another object of the invention is to provide an improved method of providing ohmic contacts to a semiconductor body by ion implantation.

These and other objects and advantages of the invention are achieved by an indirect ion implantation process in which a layer of a material which will form an ohmic contact with the semiconductor body is more or less broadly or indiscriminately applied to some preselected area of the semiconductor body. In one embodiment a selected portion of this ohmic contact layer is then irradiated with ions of an electrically inert material. The irradiated portion may be determined in accordance with the size and shape of the ion beam. An "electrically inert" material in the instant specification and claims means a material which does not establish any particular type of conductivity in the semiconductor body and which does not otherwise adversely effect the electrical or physical properties of a semiconductor body. In short, these ions are electrically inert in the semiconductor body. In another embodiment the ions may be of an electrically active material which will cooperate or react with the ohmic contact layer to form a nonrectifying connection to the semiconductor body. When the ohmic contact layer is bombarded by the ions, atoms of the ohmic contact material are thereby driven into the underlying semiconductor body to thus establish an ohmic contact thereto. All or part of the ohmic contact layer may then be removed from the surface of the semiconductor body, as desired.

The invention will be described in greater detail by reference to the drawing in which.

Figure 1:
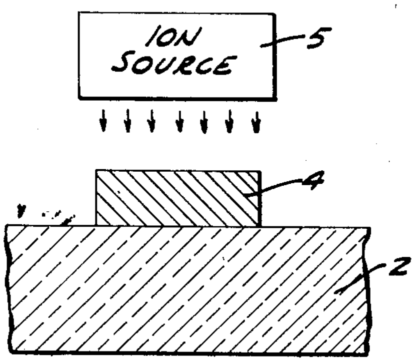
FIG. 1 is a partial cross-sectional elevational view of a semiconductor body with a layer of ohmic material disposed on the surface thereof during bombardment by a beam of ions.

Referring now to the drawings to aid in explaining the invention, the first step is to provide a semiconductor body 2 with a layer 4 of the desired contact material suitable for establishing a nonrectifying connection to the semiconductor body. The semiconductor may be any of the various semiconductors known including such elemental semiconductors as silicon and germanium as well as such compound semiconductors as gallium arsenide. The practice of the process of the invention may be of particular advantage in the fabrication of compound semiconductor devices because the low vapor pressure of such constituents of these semiconductor materials as arsenic and phosphorus (as in gallium arsenide or indium phosphide, for example) makes it impractical to heat such semiconductor bodies to the temperature required in such other processes as alloying, it being understood that such high temperature heating of the semiconductor is not required in the ion implantation process of the invention.

The ohmic contact layer 4 may be applied to the selected portion of the surface of the semiconductor body 2 by any convenient technique depending upon the physical and chemical properties of the material. Thus, the layer of ohmic contact material may be applied by vapor-deposition as in the case of gold, for example.

The next step is to place the thus-coated semiconductor body 2 in a suitable apparatus for permitting the ohmic contact layer to be ionirradiated. Since a vacuum is necessary for the formation and utilization of an ion beam, the semiconductor body will be positioned in a chamber which is evacuated and in which is disposed a suitable source 5 of ions. For the purpose of the present invention a typically suitable ion source is shown and described in the copending application of R. G. Wilson, G. R. Brewer and D. M. Jamba, Ser. No. 640,441, filed May 16, 1967, entitled "Surface Ionization Apparatus" and assigned to the instant assignee. The ohmic contact layer 4 is then subjected to bombardment or irradiation by these ions with the result that as these high-energy particles pass through the ohmic contact layer some of their momentum is transferred to individual atoms of the ohmic contact material which in turn results in driving these atoms into the crystal lattice structure of the underlying semiconductor body 2. This process is continued until the desired depth of implantation is achieved and/or the desired value of resistivity is attained. Thus the implantation process will be continued until the implanted region 6 has attained the desired physical and electrical properties. In this way an ohmic contact region may be formed (i.e., the region 6, in FIG. 2).

Figure 2:
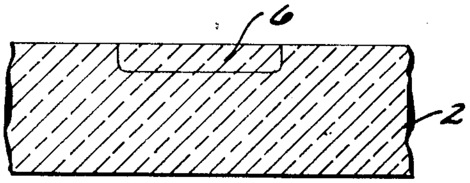
FIG. 2 is a similar view of the semiconductor body shown in FIG. 1 after implantation of the ohmic material therein and with the ohmic material layer removed therefrom.
Figure 3:
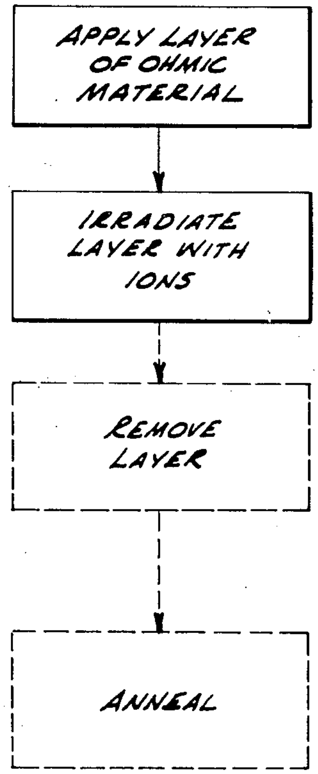
FIG. 3 is a process flow step chart of the method of the invention.

After the attainment of an ohmic contact region of the desired physical, geometrical and electrical properties the layer 4 of ohmic contact material may be removed from the surface of the semiconductor body leaving a structure such as shown in FIG. 2, the region 6 being an ion-implanted ohmic contact to the semiconductor body. In some instances it may be desirable to leave all or part of the layer of ohmic contact material in place to which electrical leads may be attached. In such event it will be noted that the actual formation of the contact by the process of the invention takes place inside the prepared structure. The contact is not exposed to possible contamination at the surface during formation and may be said to be formed under protected or passivated conditions. Leaving all or part of the contact layer in place thus preserves this protection or passivation and the actual contact never need be exposed to the air. If, however, it is desired to remove the ohmic contact layer 4, this may be accomplished mechanically or preferably chemically as by chemical etching.

It may also be necessary or at least preferable to subject the semiconductor body to a heat or annealing treatment after removal of the ohmic contact layer in order to repair any damage to the semiconductor crystal lattice structure caused by the penetration of high energy ions thereinto. The annealing operation is believed to permit the lattice structure to relax sufficiently so that atoms of the parent semiconductor structure, which may have been misplaced by collision with an incoming ion, can move back to their proper crystal structure position.

Such annealing may be satisfactorily achieved by heating the semiconductor body to a temperature of 500° C. for 10 to 20 minutes, for example. In general, the requisite annealing temperatures are much lower than those required for alloying or diffusion so that the semiconductor body is still not subjected to detrimentally high temperatures.

Suitable materials for use as a bombarding beam of electrically inert ions are any materials whose atoms are electrically inert in the semiconductor body. As explained hereinbefore, by "electrically inert" it is meant that the atoms of such materials do not contribute to electrical conduction in the semiconductor as either an acceptor or donor material. Typically satisfactory ion source materials for the purposes of the present invention are carbon or silicon itself (for silicon substrates) as well as such noble gases as helium, neon and krypton.

The ohmic contact materials that may be used are those conventionally known and used for making ohmic contacts to semiconductors. Thus such ohmic contact metals as gold or gold-antimony alloys may be utilized for such semiconductors as silicon and germanium, while for gallium arsenide an alloy of gold and tellurium may be used.

It will be appreciated that there is in general a direct relationship between the thickness of the ohmic contact layer and the energy of the ion beam: the greater the thickness of the ohmic contact layer, the higher the required beam energy. Further considerations however modify this relationship so that it is not strictly a linear one. Thus, the desired depth of implantation also depends upon the energy of the bombarding ion beam so that a greater energy than necessary merely to achieve penetration of the beam through the ohmic contact layer may be utilized in order to drive the atoms to some desired depth in the semiconductor body, it being understood that the action of driving these atoms into the semiconductor involves a transfer of momentum from the ions of the beam to the atoms of the ohmic contact material.

It is not always necessary to employ an inert ion beam in the practice of the invention. Thus, in the case where it is desired to form an ohmic contact to N-type silicon or gallium arsenide, the preferred ohmic contact materials include the constituents gold and antimony for silicon and gold and tellurium for gallium arsenide. Such contacts may be achieved by forming a layer of one constituent (i.e. gold) on the semiconductor body and then irradiating this layer with a beam of the second constituent (i.e., antimony or tellurium) ions as the case may be. The antimony or tellurium ions thus act both as a source of momentum for the gold atoms as well as a constituent of the desired ohmic contact.

There thus has been described a novel and uniquely advantageous method for making ohmic contacts to a semiconductor body. Precise positioning and geometry of the ohmic contact is achieved by the implantation method of the invention without having to utilize unduly high or detrimentally high temperatures.

In addition, because of the wide-angle scattering of the ohmic contact atoms likely to result from the transfer of momentum mechanics of the process, the depth of the implanted region may be quite shallow. Also highly intricate patterns of ohmic contacts may be achieved by the process of the invention.

What I claim is:

1. The method of making an ohmic contact to an element of a semiconductor device comprising the steps of: applying a layer of ohmic contact material on a preselected portion of a surface of said element and irradiating at least a portion of said layer with ions of an electrically inert material including the step of removing at least a portion of said layer of ohmic contact material from said surface of said semiconductor body after the step of irradiating said layer with said ions.

2. The method of making an ohmic contact to a semiconductor body comprising the steps of: applying a layer of ohmic contact material on a preselected portion of a surface of said semiconductor body, and irradiating at least a portion of said layer with ions of a second material different from said ohmic contact material including the step of removing at least a portion of said layer of ohmic contact material from said surface of said semiconductor body after the step of irradiating said layer with said ions.

3. The method according to claim 2 wherein said ions are ions of an electrically active material.

4. The method according to claim 2 wherein said ions are ions of an electrically inert material selected from the group consisting of carbon, silicon and a noble gas.

5. The method of making an ohmic contact to a semiconductor body comprising the steps of: forming a layer of one constituent of ohmic contact material on a preselected portion of a surface of a semiconductor body, and irradiating said layer with ions of a second constituent of ohmic contact material whereby atoms of said first constituent are driven into said semiconductor body with ions of said second constituent.

6. The method of making an ohmic contact to an N-type portion of a body of gallium arsenide comprising the steps of: forming a layer of gold on a preselected portion of a surface of said N-type portion; and irradiating said layer of gold with ions of tellurium whereby atoms of gold from said layer are driven into said N-type portion with said tellurium ions to form a gold-tellurium contact region.

7. The method according to claim 6 including the steps of: removing at least a portion of said layer of gold from said surface of said N-type portion after the step of irradiating said gold layer with said tellurium ions.

8. The method according to claim 7 including the step of annealing said gallium arsenide body after the step of irradiating said gold layer with said tellurium ions.

9. The method of making an ohmic contact to an N-type portion of a body of silicon comprising the steps of: forming a layer of gold on a preselected portion of a surface of said N-type portion; and irradiating said layer of gold with ions of antimony whereby atoms of gold from said layer are driven into said N-type portion with said antimony ions to form a gold-antimony contact region.

10. The method according to claim 9 including the steps of: removing at least a portion of said layer of gold from said surface of said N-type portion; and thereafter annealing said silicon body.

11. The method of introducing a conductivity-type-determining impurity into a semiconductor body comprising the steps of: applying a layer of a conductivity-type-determining impurity, capable of establishing a given type of conductivity in a semiconductor body, on a preselected portion of a surface of a semiconductor body having the same type of conductivity as said given type; and irradiating said layer with ions of an electrically inert material whereby atoms of said impurity are driven into said semiconductor body including the step of removing at least a portion of said layer of ohmic contact material from said surface of said semiconductor body after the step of irradiating said layer with said ions.